United States Patent
Pan

(12) United States Patent (10) Patent No.: US 7,495,992 B2
Pan (45) Date of Patent: Feb. 24, 2009

(54) SYSTEM FOR REDUCING WORDLINE RECOVERY TIME

(75) Inventor: Feng Pan, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 164 days.

(21) Appl. No.: 11/615,873

(22) Filed: Dec. 22, 2006

(65) Prior Publication Data

US 2008/0151630 A1 Jun. 26, 2008

(51) Int. Cl.
*G11C 8/00* (2006.01)

(52) U.S. Cl. ............... 365/230.06; 365/185.23

(58) Field of Classification Search ............ 365/230.06, 365/185.23, 189.09
See application file for complete search history.

(56) References Cited

U.S. PATENT DOCUMENTS

| | | | |
|---|---|---|---|
| 5,073,731 A | 12/1991 | Oh | |
| 5,633,827 A | 5/1997 | Numata et al. | |
| 5,940,333 A | 8/1999 | Chung | |
| 6,075,746 A | 6/2000 | Ohsawa | |
| 6,128,246 A * | 10/2000 | Takenaka | 365/230.06 |
| 6,259,632 B1 * | 7/2001 | Khouri et al. | 365/185.23 |
| 6,445,623 B1 | 9/2002 | Zhang et al. | |
| 6,909,318 B2 | 6/2005 | Du et al. | |
| 7,180,822 B2 * | 2/2007 | Hara et al. | 365/189.011 |
| 2001/0050878 A1 | 12/2001 | Yanagisawa | |
| 2005/0184795 A1 | 8/2005 | Koshita | |

OTHER PUBLICATIONS

Office Action dated Jan. 28, 2008 in U.S. Appl. No. 11/615,868.
International Search Report dated Apr. 22, 2008 from PCT Application No. PCT/US2007/087303.
Written Opinion dated Apr. 22, 2008 from PCT Application No. PCT/US2007/087303.

* cited by examiner

*Primary Examiner*—Anh Phung
(74) *Attorney, Agent, or Firm*—Davis Wright Tremaine LLP

(57) ABSTRACT

System for reducing wordline recovery time for a wordline having a wordline capacitance $C_{WL}$ by configuring the wordline capacitance $C_{WL}$ and a load capacitance $C_L$ in a series configuration with respect to a first node. Supplying a charging current at a first node from a charge pump having an initial low voltage output voltage.

17 Claims, 10 Drawing Sheets

$$\Delta V_{wl} = \frac{C_1}{C_1 + C_2} V_{supply}; \text{ if } C_1 = C_2, \text{ then } V_{wl} = .5 V_{supply}$$

SYSTEM FOR REDUCING WORDLINE RECOVERY TIME

CROSS REFERENCE TO RELATED APPLICATIONS

This application is related to co-pending patent application titled, "METHOD OF REDUCING WORDLINE RECOVERY TIME" by Pan filed Dec. 22, 2006 having application Ser. No. 11/615,868 that is incorporated by reference in its entirety for all purposes.

FIELD OF THE INVENTION

The present invention relates generally to memory devices. More particularly, the present invention relates to using charge pumps operating in a highly efficient mode to reduce wordline recovery time.

BACKGROUND

As microprocessor systems increase in size and speed, there is need for larger and faster memory arrays. These high-speed memory arrays may contain a large number of memory cells. However, as the number of memory elements increases, the time needed to read and/or write to the individual memory cells may also increase. This may be due to the fact that as the number of memory elements increases in an individual array, the length of the wordline between the supply voltage and the individual memory cells may also increase. The increased length of the wordline may directly relate to an increase in the resistance of the wordline. Therefore, as the size of the memory array increases so may the required voltage needed to read the individual memory cells. Additionally, in large memory arrays, the capacitance of the wordline may require an increase in the time required charge to the desired level in order to access a given memory cell. The increase in the time required to charge the wordline may lead to a large cycle time, which may directly limit the access time for the memory. Additionally, the increase in the time required to charge the capacitance may also limit the length of the wordline. As the length of the wordline increases so does the resistance value of the wordline wire. Therefore, the time required to charge the capacitance may be limited by the large RC value associated with a longer wire.

For example, FIG. 1A shows a representative prior art arrangement whereby wordline 100 having wordline capacitance $C_{wl}$ is coupled to high voltage charge pump 102 by way of switch circuit 104. As shown in FIG. 1B, at time $t_1$, charge pump 102 goes into regulation providing pump current $I_{pump}$ at charge pump output node 106. In order for wordline voltage $V_{wl}$ to recover to $V_{reg}$, switch circuit 104 connects wordline 100 to charge pump output node 106 at time $t_2$ (causing the momentary decrease in $V_{reg}$ due to charge sharing). At time $t_3$, wordline voltage $V_{wl}$ reaches target wordline voltage $V_{reg}$. In this arrangement, the wordline recovery time ($\Delta t = t_3 - t_2$) is determined as Eq(1):

$$\Delta t = (C_{wl} \times V_{reg})/I_{pump} \qquad \text{Eq(1)}$$

There have been many attempts at improving the wordline recovery time $\Delta t$. One such attempt relies upon using what is referred to as stacked memory cell in which a large single array is broken into a number of smaller arrays thereby reducing the resistive/capacitive loading (i.e., RC time constant) of the array as a whole. However, this approach requires a substantial increase in the amount of silicon used since the amount of silicon required increases proportionally with the number of memory arrays included in the stacked architecture as does manufacturing costs. Other attempts to reduce wordline time recovery rely upon simply increasing charge pump current $I_{pump}$. Unfortunately, in order to increase the capacity of high voltage charge pump 102, not only does the size of high voltage charge pump 102 increase but charge pump 102 operates at a higher output voltage $V_{ref}$ and is therefore operating less efficiently. Each of these factors contribute in their own way to an overall increase in power consumption of the memory device as well as the amount of silicon required for fabrication of the larger capacity charge pumps.

Therefore, what is required is a system for reducing wordline recovery time.

SUMMARY

The invention can be implemented in numerous ways. Several embodiments of the invention are discussed below. As a system for increasing a wordline voltage level $V_{WL}$ of a selected wordline having a wordline capacitance $C_{WL}$ from an initial wordline voltage level $V_{WLI}$ to a pre-determined target voltage level $V_{WLT}$, one embodiment of the present invention includes: a wordline voltage supply arranged to provide a wordline voltage; a first switch arranged to connect the wordline voltage supply to the selected wordline at a first node through a load capacitance $C_L$ in response to a first signal; and a second switch arranged to disconnect the wordline supply voltage from the selected wordline at a second node such that the wordline capacitance $C_{WL}$ and a load capacitance $C_L$ are connected in a series configuration with respect to the first node, wherein a wordline voltage supplied by the wordline voltage supply at the first node results in a charging current at the first node that charges up the series combination of the wordline capacitance $C_{WL}$ and the load capacitance thereby increasing the wordline voltage level $V_{WL}$.

In a memory device having a number of wordlines, a system for substantially reducing an amount of time required for a wordline voltage level ($V_{WL}$) of a selected wordline having a wordline capacitance $C_{WL}$ to reach a pre-determined operating voltage level is described. In one embodiment of the invention, the system includes: a charge pump arranged to supply a wordline charging voltage; a first switch arranged to connect the selected wordline to the charge pump through a load capacitance $C_L$ at a first node in response to a switch signal; and a second switch arranged to disconnect the selected wordline from the charge pump at a second node in conjunction with the first switch in response to the signal such that the load capacitance $C_L$ is in series with the wordline capacitance $C_{WL}$ with respect to the charge pump at the first node, wherein the charge pump provides the wordline charging voltage at the first node thereby increasing the wordline voltage $V_{WL}$ by charging up the wordline capacitance, wherein the charge pump has an initial charge pump output of approximately 0V which is much more efficient than operating with the initial charge pump output at very high potential In the described embodiments the wordline is connected to non-volatile memory cells arranged to form a non-volatile memory array suitable for storing data. The non-volatile memory array is arranged in a NAND-type memory array architecture having a number of wordlines and bitlines. Additionally, the described method is contemplated for use on a multilevel type memory array that when programmed stores data in the form of at least one lower page and at least one associated upper page.

BRIEF DESCRIPTION OF THE DRAWINGS

The invention, together with further objects and advantages thereof, may best be understood by reference to the following description taken in conjunction with the accompanying drawings.

In the drawings, like reference numerals designate like structural elements. Also, it should be understood that the depictions in the figures are not to scale.

DETAILED DESCRIPTION

In the following description, numerous specific details are set forth in order to provide a thorough understanding of the present invention. It will be apparent, however, to one skilled in the art that the present invention may be practiced without some or all of these specific details. In the description below, a memory cell is programmed using a next neighbor wordline as an injector for providing hot carriers. The objective is to use low voltage biasing to prevent and therefore substantially eliminate programming problems related to high voltage, small geometries, and resultant high electric fields.

Figure 1A:
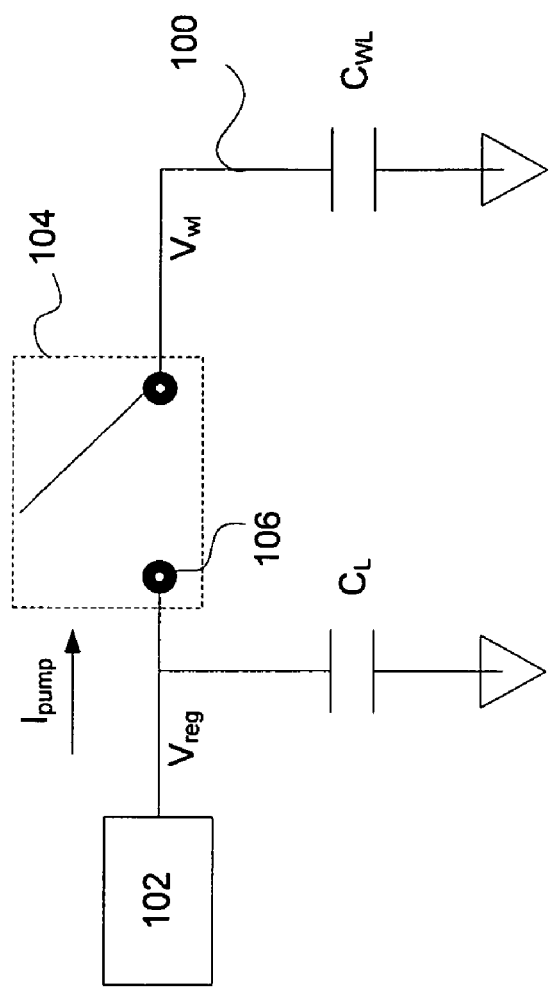
FIGS. 1A and 1B show a representative prior art arrangement whereby a wordline having wordline capacitance $C_{wl}$ is coupled to charge pump by way of switch circuit.
Figure 1B:
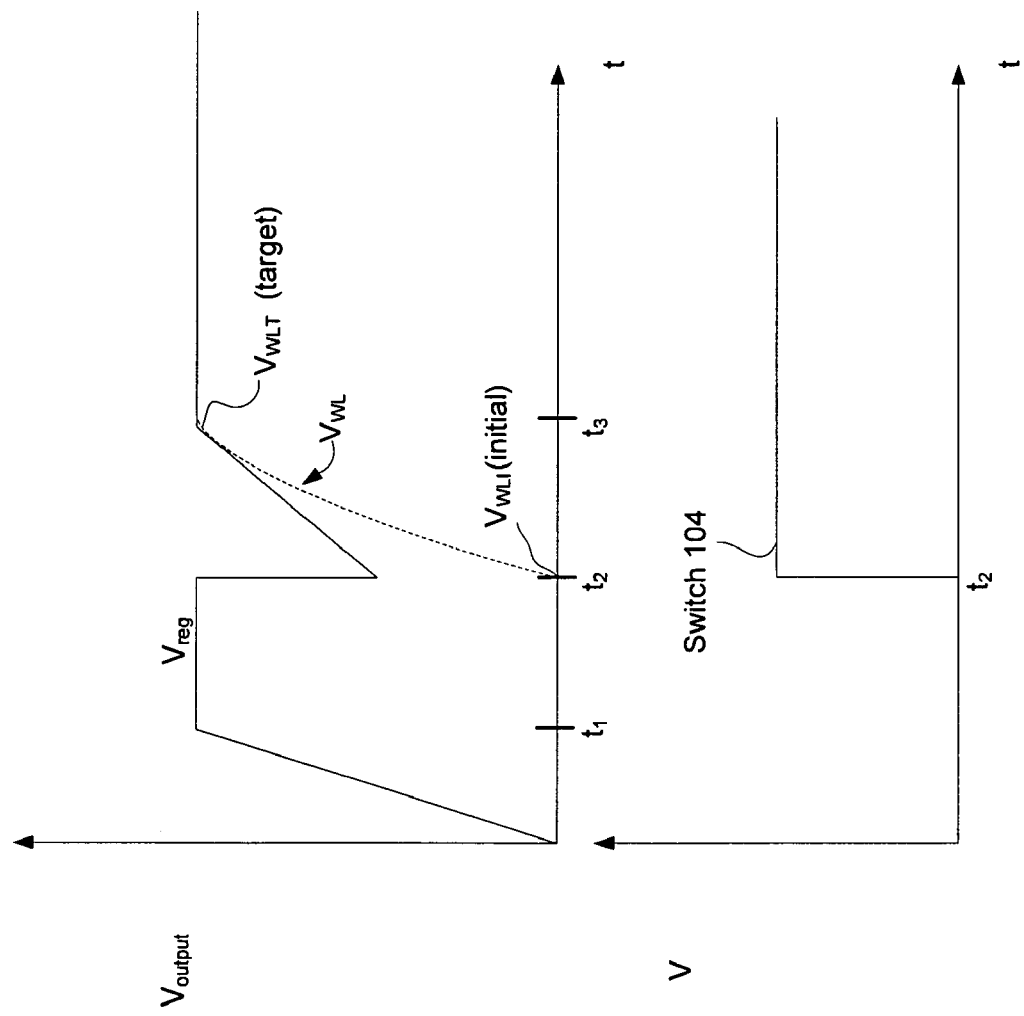
Figure 2:
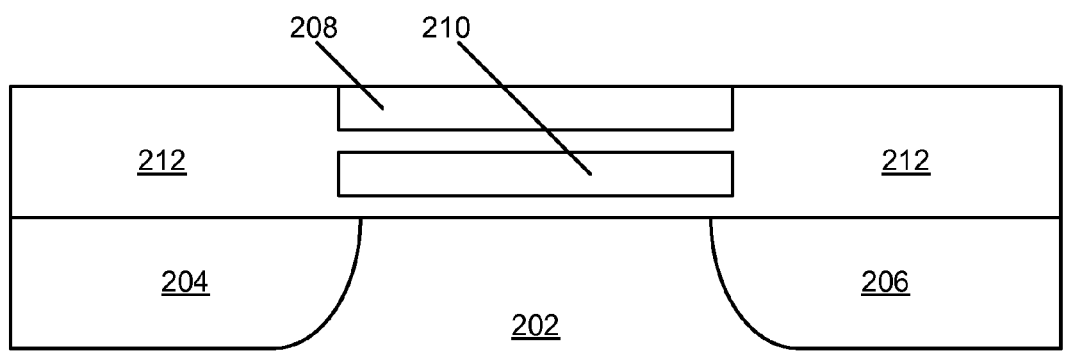
FIG. 2 illustrates an exemplary MOSFET having a floating gate.
Figure 3:
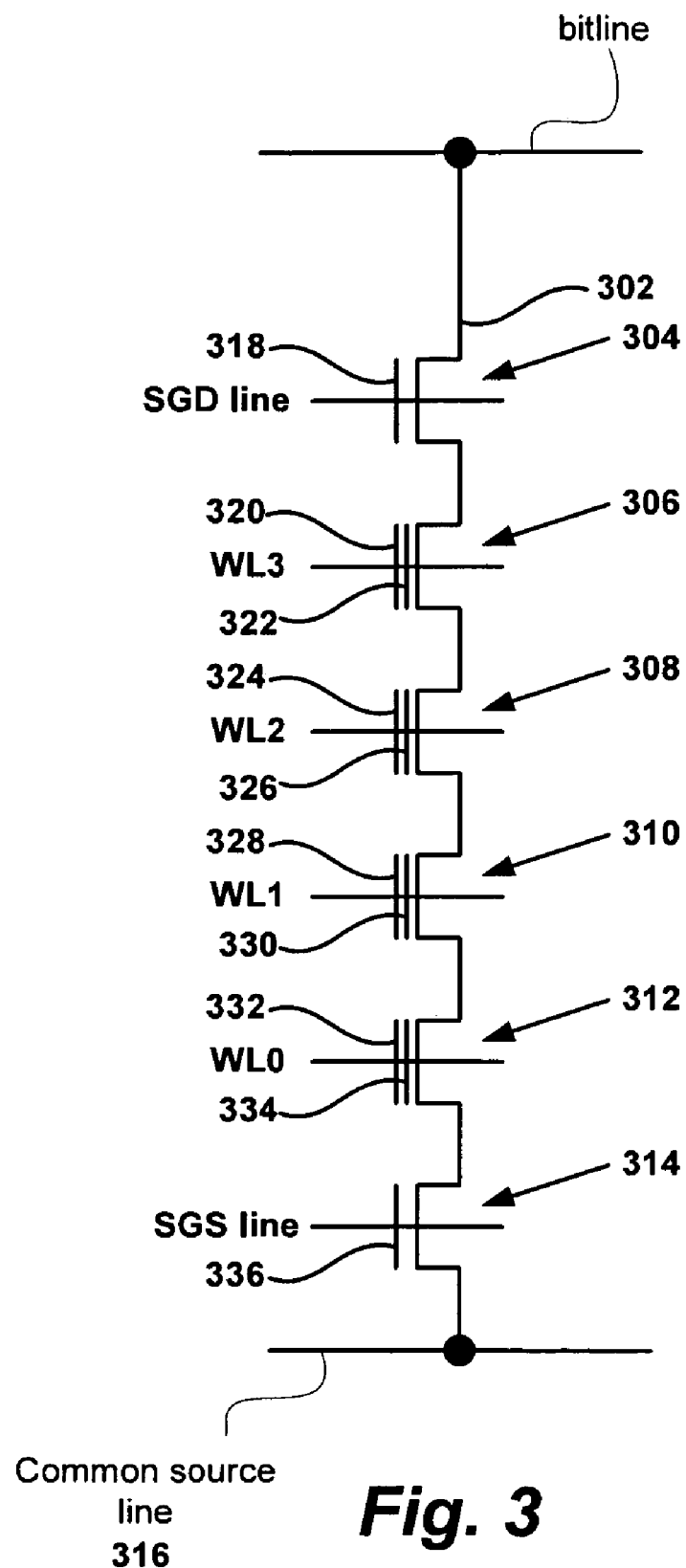
FIG. 3 illustrates an exemplary non-volatile memory string.

With reference to FIGS. 2 and 3, a representative non-volatile memory storage array will be described. In the described embodiment, the non-volatile memory storage system is a flash memory chip having a NAND architecture, although the present invention is applicable to other forms of non-volatile memory including EPROM and EEPROM, and additionally to NOR architectures as well. In the described embodiment, the array consists of non-volatile memory storage elements that are p-type substrate floating gate MOSFETs. FIG. 2 illustrates a representative floating gate MOSFET, such as that used in this architecture, having a substrate 202, a source 204, a drain 206, a control gate 208, a floating gate 210, and a dielectric 212 surrounding the floating gate.

In NAND flash memory, a number of such transistors, also known hereafter as cells, memory cells or memory storage elements, are arranged in series. On either side of the series of memory cells is an additional transistor known as a select transistor, or gate. Collectively, the memory cells and two select gates are referred to as a NAND string. By way of illustration, the equivalent circuit of a 4-transistor NAND string is illustrated in FIG. 3. The four memory cells are labeled 306, 308, 310 and 312. The first select gate 304, referred to as the select gate drain (SGD), connects the NAND string to bitline 302. The second select gate 314, referred to as the select gate source (SGS), connects the NAND string to source line 316. Select gates 304 and 314 are controlled by control gates 318 and 336, respectively. An SGD line controls the control gate 318 for the select gate 304, while an SGS line controls the control gate 336 for the select gate 314. The four series transistors 306-312 each have both a control gate and a floating gate. For example, transistor 306 has a control gate 320 and a floating gate 322; transistor 308 has a control gate 324 and a floating gate 326; transistor 310 has a control gate 328 and a floating gate 330; and transistor 312 has a control gate 332 and a floating gate 334. Control gates 320, 324, 328 and 332 are connected to wordlines WL(3), WL(2), WL(1) and WL(0), respectively. It should be noted that although the example provided describes a NAND string that includes four memory cells, other numbers of cells may be arranged in series and are permissible as well.

Figure 4A:
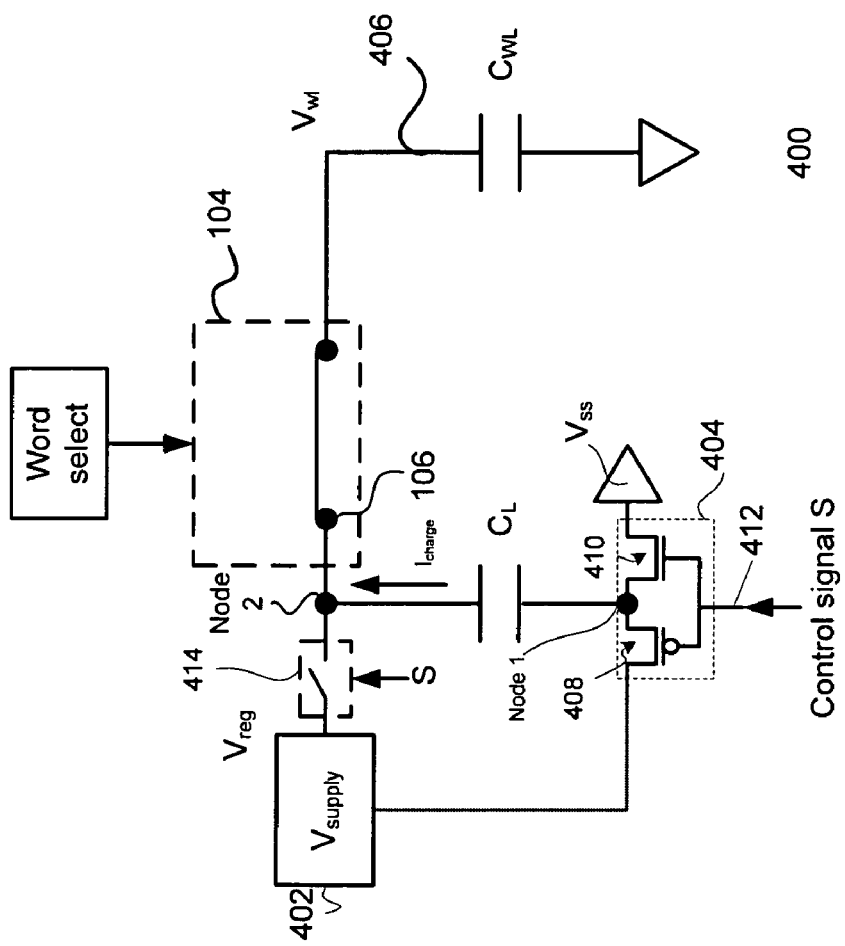
FIGS. 4A-4C illustrates a representative wordline charging circuit in accordance with an embodiment of the invention.

FIG. 4A is a block diagram of a circuit 400 for charging a high-speed wordline in accordance with some embodiments of the present invention. The circuit 400 includes a wordline voltage supply 402 for providing a wordline supply voltage $V_{supply}$. (It should be noted that wordline supply voltage 402 can be implemented as a charge pump or as a voltage supply such as $V_{cc}$). In the described embodiment, switch 404 responds to control signal S by connecting wordline supply voltage 402 to wordline 406 at node 1 and switch 414 responds to control signal S by disconnecting wordline supply voltage 402 from node 2 of wordline 406. In this way, load capacitance $C_L$ and wordline capacitance $C_{WL}$ are in series configuration with respect to wordline supply voltage 402 (see FIG. 4B). It should be noted that generally switch 104 responds to signals provided by a wordline select circuit (such as a wordline decoder) to select wordline 406 to node 106. In some embodiments of the present invention, switch 404 is a complimentary metal oxide semiconductor (CMOS) inverter that includes a p-type MOS (PMOS) transistor 408 and an n-type MOS (NMOS) transistor 410. The source of the PMOS transistor 408 is connected to wordline voltage supply 402, the drain of the PMOS transistor 408 is connected to the drain of the NMOS transistor 410 while the source of the NMOS transistor 410 is connected to the a reference voltage, such as $V_{ss}$. A control signal line 412 for carrying control signal S is connected to the gate of both the PMOS transistor 408 and the NMOS transistor 410. In operation, when the control signal S is a logic "low", the NMOS transistor 410 is "OFF" and the PMOS transistor 408 may be "ON" and switch 414 is open so that wordline supply voltage 402 is disconnected from wordline 406 at node 2 and connected to the bottom plate of load capacitance $C_L$ through switch 404.

It should be noted that implementing switch 404 as a CMOS inverter provides several advantages. For example, the "HIGH" and "LOW" output levels of control signal S are such that high noise margins can be realized and the logic levels of the switch 404 is not dependent upon the relative device sizes. Furthermore, the CMOS inverter has a low output impedance, which may make it less sensitive to noise and other disturbances.

Figure 4B:
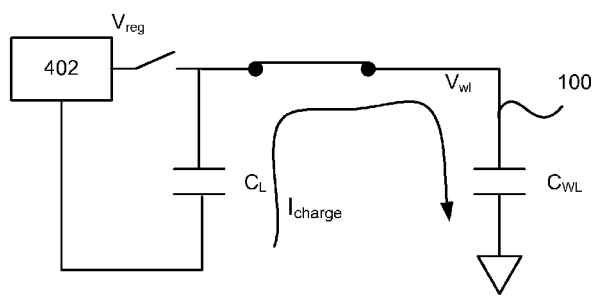
Figure 4C:
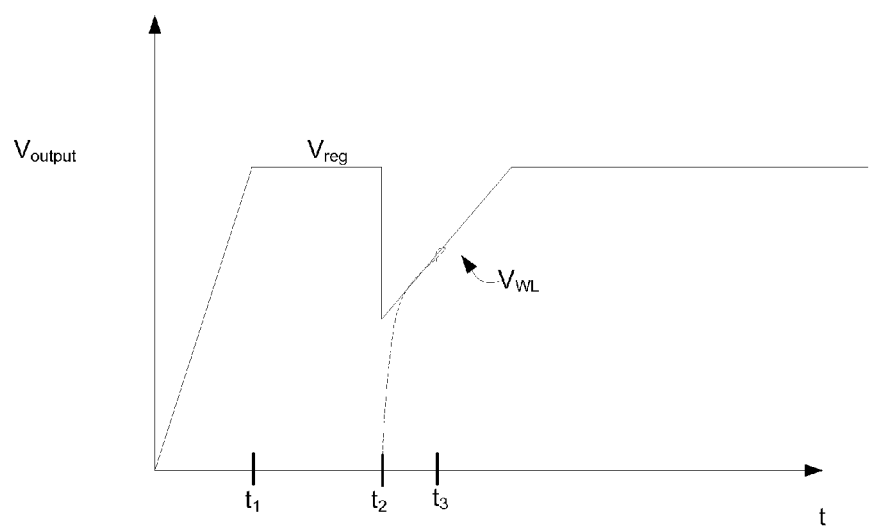

As shown in FIG. 4B, when switch 404 connects wordline voltage supply 402 to wordline 406 at node 1 and switch 414 disconnects wordline voltage supply 402 from wordline 406 at node2, charging current $I_{charge}$ charges up both load capacitance $C_L$ and wordline capacitance $C_{wl}$. In this way, an amount of time required to restore wordline voltage $V_{wl}$ to the target wordline voltage $V_{reg}$ is substantially reduced than that with conventional arrangements (as shown in FIG. 4C).

Figure 5:
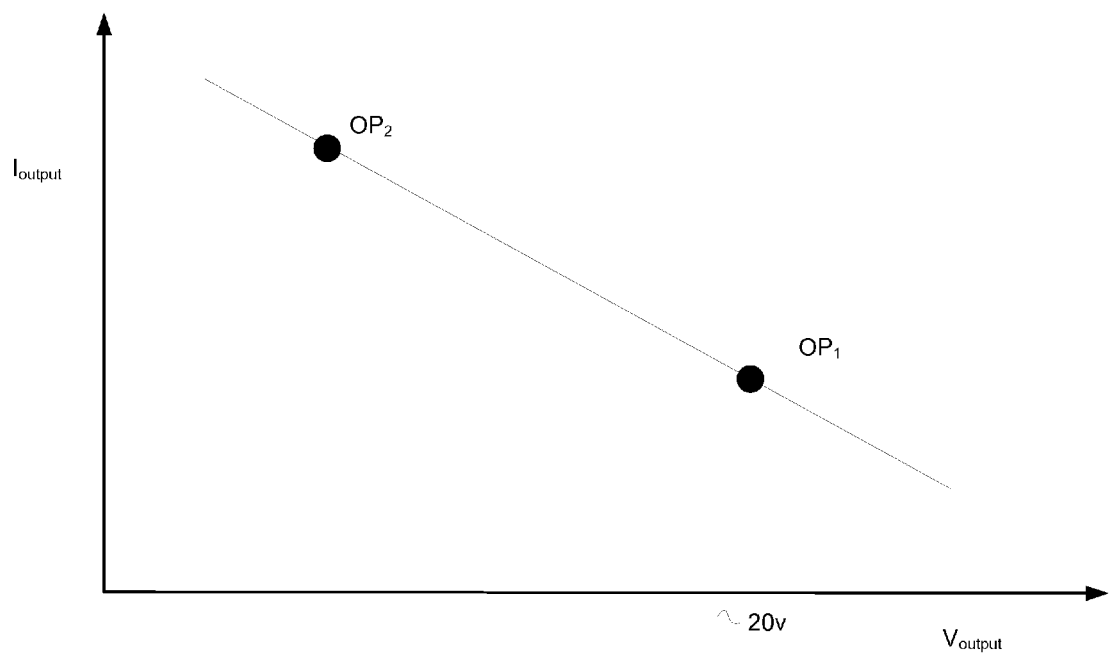
FIG. 5 shows operating regimes of output current capabilities for a high output voltage and low output voltage charge pumps in accordance with an embodiment of the invention.
Figure 6:
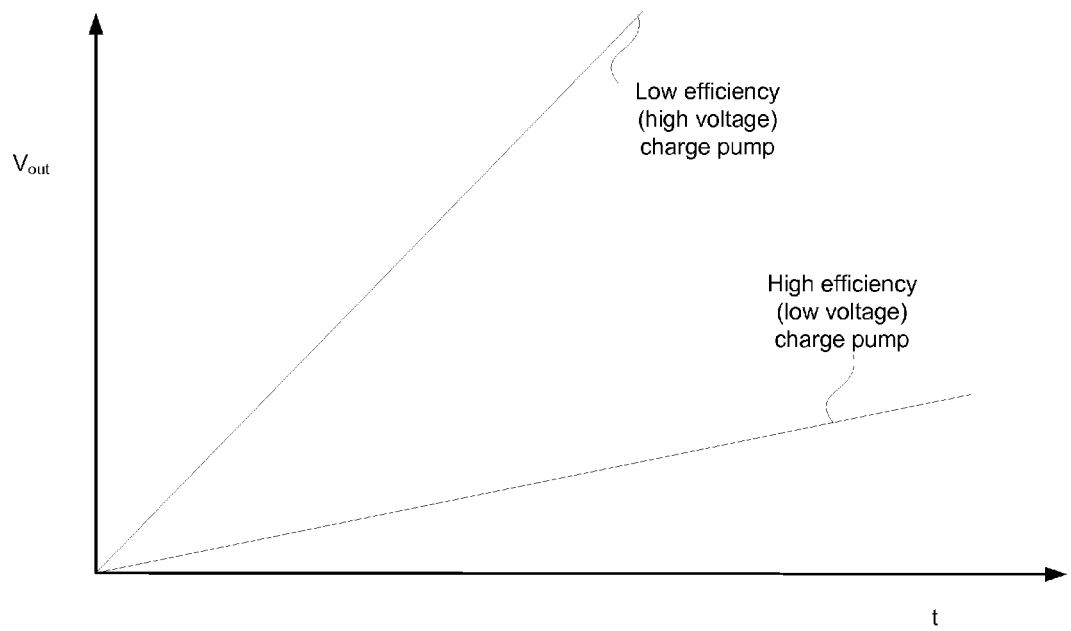
FIG. 6 shows a graph describing a relationship between amount of charge ΔQ at a particular load L provided by the high voltage and low voltage charge pumps of FIG. 5 as a function of charge pump output voltage V and time t.

It should be noted that in those cases where wordline voltage supply 402 is a charge pump, disconnecting charge pump 402 from wordline 406 at node 2 and re-connecting charge pump 402 to wordline 406 at node 1, allows charge pump 402 to start charge pump output from approximately 0V which is much more efficient than operating with charge pump output at very high potential. As shown in FIG. 5, by operating the high efficiency regime (represented as OP2), a charge pump is able to provide a substantially larger amount of charge ΔQ at a given $V_{out}$ for a given load than that provided by a charge pump operating with charge pump output at very high potential (20V, for example) under the same conditions (represented as OP1) as shown in FIG. 6. Therefore, even operating at a lower $V_{out}$, the low voltage, high efficiency charge pump provides for higher ΔQ/Δt for a given load thereby substantially reducing wordline recovery time $\Delta t_{wl}$ over that provided by a high voltage, lower efficiency charge pump, such as charge pump 102.

In this way, circuit 400 utilizes a low voltage, high efficiency charge pump (or other appropriate voltage supply) to provide the requisite charge ΔQ (i.e, ($C_{wl} \times V_{supply}$)) required to charge wordline capacitor $C_{wl}$ consistent with wordline voltage $V_{wl}$ being target wordline voltage $V_{reg}$. The relationship between the various parameters can be described as shown in equations 2-4:

$$C_{load} = C_L \times C_{wl}/(C_L + C_{wl}) \qquad \text{Eq (2)}$$

$$\Delta V_{wl} = (C_L/(C_L + C_{wl})) \qquad \text{Eq (3)}$$

$$Q_{total} = V_{supply} \times C_{wl}; \qquad \text{Eq (4)}$$

if $C_L = C_{wl}$, then $C_{load} = 0.5 C_{wl}$ and $\Delta V_{wl} = 0.5 V_{supply}$.

Figure 7:
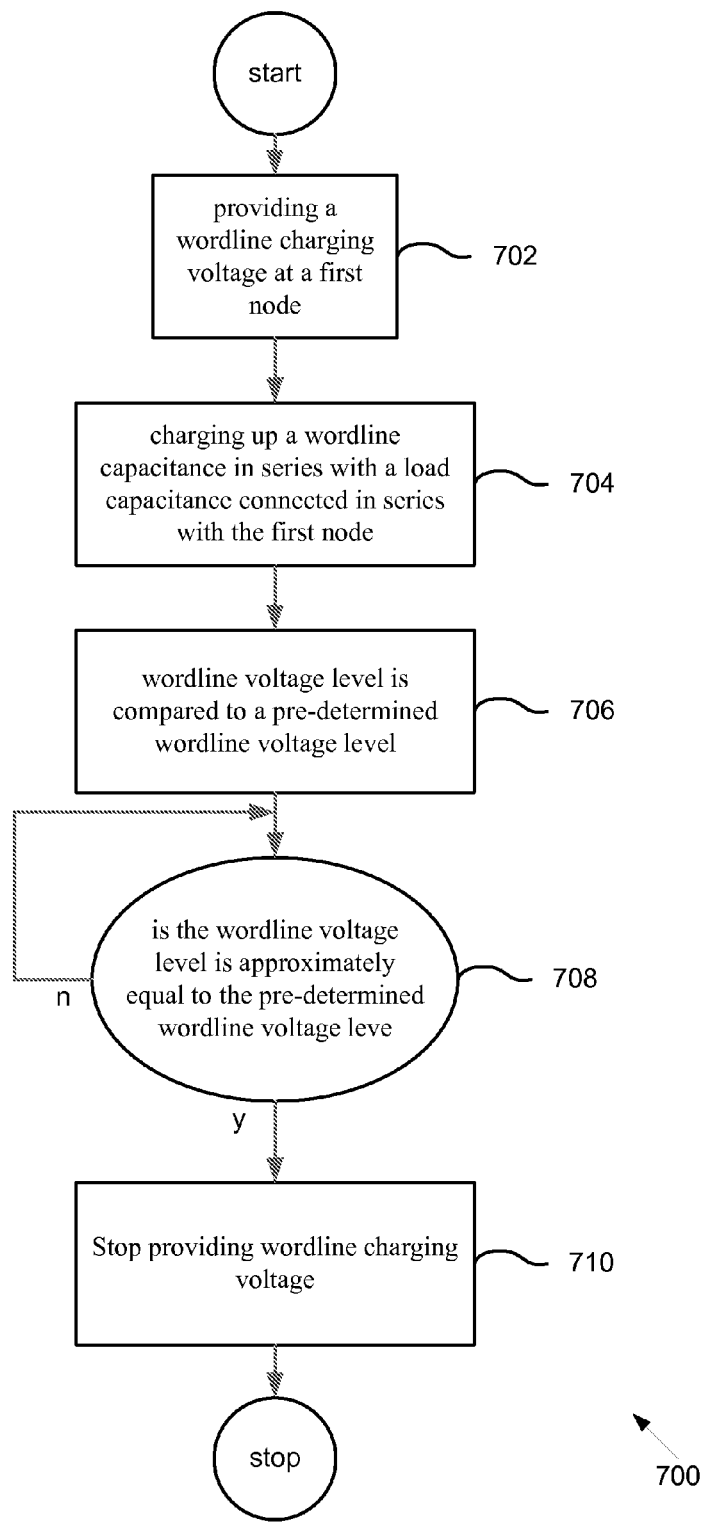
FIG. 7 shows a flowchart detailing a process of substantially reducing an amount of time required for a wordline voltage level to reach a pre-determined operating voltage level.

FIG. 7 shows a flowchart detailing a process 700 of substantially reducing an amount of time required for a wordline voltage level to reach a pre-determined operating voltage level. Accordingly, process 700 includes the following operations: at 702, providing a wordline charging voltage at a first node and at 704 charging up a wordline capacitance in series with a load capacitance connected in series with the first node. In the described embodiment, the wordline charging voltage is provided by a low voltage, high efficiency charge pump or equivalent and any high voltage, low efficiency charge pumps are disconnected. At 706, wordline voltage level is compared to a pre-determined wordline voltage level. At 708, if the wordline voltage level is approximately equal to the pre-determined wordline voltage level, then at 710, the wordline charging voltage is no longer applied to the first node. In the described embodiment, the high voltage charge pump is then re-connected.

Although only a few embodiments of the invention have been described in detail, it should be appreciated that the invention may be implemented in many other forms without departing from the spirit or scope of the invention. Although specific features and conditions have been described, it should be appreciated that a wide variety of implementations, such as bias conditions and method combinations, may be modified and employed as well. In addition, although in physical construction the present invention is applied to a conventional non-volatile memory system without modification, it should be appreciated by one skilled in the art that the structure could be modified to enhance the effects of the present invention. Accordingly, the present embodiments are to be considered as illustrative and not restrictive and the invention is not to be limited to the details given herein, but may be modified within the scope of the appended claims.

What is claimed is:

1. A system for increasing a wordline voltage level $V_{WL}$ of a selected wordline having a wordline capacitance $C_{WL}$ from an initial wordline voltage level $V_{WLI}$ to a pre-determined target voltage level $V_{WLT}$, comprising:
   a wordline voltage supply arranged to provide a wordline voltage;
   a first switch arranged to connect the wordline voltage supply to the selected wordline at a first node through a load capacitance $C_L$ in response to a first signal; and
   a second switch arranged to disconnect the wordline supply voltage from the selected wordline at a second node such that the wordline capacitance $C_{WL}$ and a load capacitance $C_L$ are connected in a series configuration with respect to the first node, wherein a wordline voltage supplied by the wordline voltage supply at the first node results in a charging current at the first node that charges up the series combination of the wordline capacitance $C_{WL}$ and the load capacitance thereby increasing the wordline voltage level $V_{WL}$.

2. A system as recited in claim 1 wherein the wordline voltage supply is a charge pump.

3. A system as recited in claim 2, wherein when the first node is connected to the charge pump in a series configuration by way of the first switch the charge pump has an initial charge pump output of approximately 0V which is much more efficient than operating with the initial charge pump output at very high potential.

4. A system as recited in claim 2, wherein in response to a second signal the second switch re-connects the charge pump to the selected wordline at the second node and the first switch concurrently disconnects the charge pump from the selected wordline at the first node such that the wordline capacitance $C_{WL}$ and the load capacitance $C_L$ are in a parallel configuration with respect to the charge pump.

5. A system as recited in claim 3, further comprising:
   a control signal input line connected to the first switch and the second switch.

6. A system as recited in claim 4, further comprising:
   a control signal generator coupled to the control signal line arranged to provide the first signal and the second signal by way of the control signal line to the first switch and the second switch circuit when needed.

7. A system as recited in claim 4, wherein the first switch and the second switch are each a CMOS inverter circuit.

8. A system as recited in claim 1, wherein the wordline is incorporated into a non-volatile memory array.

9. A system as recited in claim 1, wherein the wordline voltage supply is a reference voltage supply.

10. A system as recited in claim 1, further comprising:
    a monitor unit arranged to monitor the wordline voltage $V_{WL}$.

11. A system as recited in claim 10, wherein when the wordline voltage $V_{WL}$ is approximately equal to the target wordline voltage $V_{WLT}$, the monitor signals the control signal generator to generate and apply the second signal.

12. In a memory device having a number of wordlines, a system for substantially reducing an amount of time required for a wordline voltage level ($V_{WL}$) of a selected wordline having a wordline capacitance $C_{WL}$ to reach a pre-determined operating voltage level, comprising:
    a charge pump arranged to supply a wordline charging voltage;
    a first switch arranged to connect the selected wordline to the charge pump through a load capacitance $C_L$ at a first node in response to a switch signal; and a second switch arranged to disconnect the selected wordline from the charge pump at a second node in conjunction with the first switch in response to the signal such that the load capacitance $C_L$ is in series with the wordline capacitance $C_{WL}$ with respect to the charge pump at the first node, wherein the charge pump provides the wordline charging voltage at the first node thereby increasing the wordline voltage $V_{WL}$ by charging up the wordline capacitance, wherein the charge pump has an initial charge pump output of approximately 0V which is much more efficient than operating with the initial charge pump output at very high potential.

13. A system as recited in claim 12, wherein the first switch and the second switch are each coupled to a control signal input line.

14. A system as recited in claim 13, wherein the first switch and the second switch are each a CMOS inverter circuit.

15. A system as recited in claim 12, wherein the memory device is a non-volatile memory device.

16. A system as recited in claim 12, wherein the charge pump is replaced by a reference voltage supply.

17. A system as recited in claim 12, further comprising:
a monitor unit coupled to the wordline for monitoring the wordline voltage $V_{WL}$, wherein when the monitored wordline voltage $V_{WL}$ is at least equal to the wordline target voltage $V_{WLT}$ then the monitor unit signals the first switch to disconnect the selected wordline from the charge pump at the first node; and signals the second switch to re-connect the selected wordline from the charge pump at the second node in conjunction with the first switch resulting in load capacitance $C_L$ being in a parallel configuration with wordline capacitance $C_{WL}$ with respect to the wordline voltage supply.

* * * * *